US012723585B1

(12) United States Patent
Steiger et al.

(10) Patent No.: US 12,723,585 B1
(45) Date of Patent: Sep. 1, 2026

(54) PUMP MONITOR WITH METAL DETECTOR ALARM CONTROLLER

(71) Applicant: Sump Alarm, Inc., St. Louis, MO (US)

(72) Inventors: Scott J. Steiger, St. Louis, MO (US); Danny J. Simpson, Mesa, AZ (US)

(73) Assignee: Sump Alarm, Inc., St. Louis, MO (US)

( * ) Notice: Subject to any disclaimer, the term of this patent is extended or adjusted under 35 U.S.C. 154(b) by 0 days.

(21) Appl. No.: 19/305,165

(22) Filed: Aug. 20, 2025

Related U.S. Application Data

(60) Provisional application No. 63/685,568, filed on Aug. 21, 2024.

(51) Int. Cl.

| | |
|---|---|
| ***F04B 51/00*** | (2006.01) |
| ***F04B 53/16*** | (2006.01) |
| ***H03K 17/95*** | (2006.01) |

(52) U.S. Cl.
CPC .............. *F04B 51/00* (2013.01); *F04B 53/16* (2013.01); *H03K 17/952* (2013.01)

(58) Field of Classification Search
CPC ........ G01F 23/00; G01F 23/241; G01F 23/68; G01F 25/20; G08B 21/182; G08B 21/20; G08B 25/007; F04B 51/00; F04B 53/16; H03K 17/952
USPC .......................................................... 417/63
See application file for complete search history.

(56) References Cited

U.S. PATENT DOCUMENTS

| | | | |
|---|---|---|---|
| 9,441,625 | B2 | 9/2016 | Schoendorff |
| 10,436,608 | B2 | 10/2019 | Thoss et al. |
| 10,699,551 | B1 | 6/2020 | Steiger |

*Primary Examiner* — Mark A Laurenzi
*Assistant Examiner* — Benjamin Doyle
(74) *Attorney, Agent, or Firm* — Carmody MacDonald P.C.; Dennis JM Donahue, III; Kevin C. Staed

(57) ABSTRACT

A contactless control system for a pump monitoring device provides TEST and SILENCE functionality without penetrating a weather-resistant enclosure. A printed-circuit board within the enclosure carries a planar spiral transmit coil on one face and at least one planar receive coil on the opposite face, arranged to form a coupled resonant metal detector. The coils operate at a frequency, optionally a carrier frequency gated at a lower frequency, with optional ferrite material to increase magnetic field density through the enclosure wall. Two spatially separated receive coils may be wired in opposition to reject common-mode noise. Placement of a metallic object adjacent to the exterior wall produces a proximity signal that toggles the system between test and silence modes. The system is suitable for grinder pumps, septic pumps, and lift stations, and eliminates mechanical switches, enclosure penetrations, and sealing gaskets while reducing installation cost and improving reliability in outdoor environments.

20 Claims, 8 Drawing Sheets

PUMP MONITOR WITH METAL DETECTOR ALARM CONTROLLER

CROSS-REFERENCE TO RELATED APPLICATIONS

This application claims priority from U.S. Provisional Patent Application No. 63/685,568 filed on Aug. 21, 2024 which is hereby incorporated by reference herein.

BACKGROUND OF THE INVENTION

Field of the Invention

The present invention relates generally to control and alarm systems for pumping equipment. More particularly, the invention relates to contactless switching for pump control panels.

Related Art

A recurring issue with current designs of pump monitoring and alarm systems is the use of a switch for testing the operation of the system and/or for silencing an alarm. A physical toggle switch for an outdoor enclosure, such as shown in FIG. 1, or a tactile switch that is mounted onto a PCB (Printed Circuit Board) extends through the plastic enclosure. To be satisfactory for outdoor usage, a gasket is required to make a watertight seal in the hole in the enclosure through which the switch extends, and a rubber boot must cover the switch to keep water from entering the switch itself. It is also possible to have a PCB board with tactile switches, in which case an actuator extends through a hole in the enclosure which is covered by a plastic label through which the user can depress the switch to test or silence an alarm condition. The plastic cover can fail and is not typically suitable in outdoor environments. For years, these types of controls have been a challenge adding cost and complexity to design. Additionally, many homeowners associations, municipalities, and even companies have specifications requiring this functionality to be accessed outside of the control panel for reasons of both safety and accessibility. It's not unusual that there are also standards indicating that these electrical panels (often controlling important water and sewage resources) be locked for the same group of reasons.

The alarm testing and/or silencing function in the existing devices falls into two (2) basic categories with one category being mechanical switches (with and without electromechanical relays) and the other category being tactile switches in conjunction with a printed circuit board. Both categories for this functionality are described below. The installation of the mechanical switches is used heavily and predominantly in outdoor rated applications while the tactile switches are more likely to be used for indoor applications, with some deployments into the outdoor control panel market.

The mechanical switches in test/silence (T/S) controls and hand-off auto (HOA) selectors can be implemented most simply by a maintained SPST or SPDT toggle switch. In this case, a relay is not necessary. The switch simply cuts the power to the audible horn and optionally the beacon on the alarm. Maintained Switches require the user to remember that the switch has been turned to silence, which often results in the switch position being forgotten and often permanently left in the SILENCE position.

An improvement on the maintained switch is the use of a momentary switch. When the momentary switch is used, an electromechanical relay is required to capture the momentary activation of the switch and put the alarm into either test or silence mode. With the addition of the relay and simple latching circuit, the user no longer needs to remember the position of the switch, and the alarm will clear itself when the fault condition goes away.

In both above cases, an enclosure (generally a plastic weather-resistant enclosure) needs a hole to be drilled, the toggle switch must be inserted, a gasket put over the threaded end of the switch (now protruding through the enclosure wall to the elements) and generally a rubberized boot over the switch actuator outside of the enclosure. Internal to the enclosure, there are typically ¼" quick connects to which wires connect that can be connected to the relay or other circuitry. Considering that the switch costs several dollars without the boot, the drilling of plastic enclosures requires labor, and a relay adds several additional dollars, it would be beneficial if a solid-state option could be found which doesn't require a physical switch, a relay, or any drilling operations to penetrate the electrical enclosure In applications where there is already a printed circuit board in the enclosure, the typical method for a user to indicate to TEST or SILENCE an alarm on the device is done implementing some type of tactile switch that is on the PCB board internal to the device. This leaves the designer with few options on how to have a user interaction externally to the enclosure to result in the activation of the proper output from the printed circuit board to the alarm circuitry which is connected to a light and/or horn.

FIG. 2 demonstrates a traditional method of implementation of a tactile switch used for TEST/SILENCE capability. The signal output from the system is fed to a "flip-flop". The flip-flop goes into alarm state from a true alarm or from a depression of the TEST switch. If the alarm is present and the TEST switch is depressed the alerts are silenced. If the original alarm condition goes away, the system will return to the original state and be ready for the next activity. If there is no alarm present, and the user presses the TEST button, the alarm will sound, indicating to the user that the system is working. In AC variations, this could be done with a toggle switch and mechanical relay. The Flip Flop is used to maintain the state of the alarm and turn a beacon and horn on or off depending on the state of the system and the user input to S3, the "Test Switch".

In the applications where a PCB mounted tactile switch is used in an outdoor enclosure, there needs to be some type of instrument to reach from the printed circuit board through the enclosure where the user can depress a button to trigger the TEST and SILENCE function. There are many options available for tactile switches with extended actuators. At the time of this writing a review of most electronic parts distributors shows that the longest actuator length that is available is about 19 mm, which is quite limited in many applications as it indicates that the distance from the printed circuit board through the enclosure wall (generally a 2 mm minimum wall thickness) can be a maximum of 15-16 mm. In cases where a PCB cannot be mounted within 16 mm of the wall, this again leads back to the more expensive toggle switch and its associated installation cost and life. In cases where it is possible to use a tactile switch it still requires a hole in the enclosure. Even in fully automated injection molding applications the enclosure holes are generally milled after the enclosure has been removed from the injection molding machinery, and the opening generally is covered (a requirement for outdoor applications) by a plastic label of some sort to prevent water intrusion, which can become brittle over time and crack as it is exposed to the cold and UV. It's also important to note that for an outdoor panel, temperature can vary from −40° C. in upper U.S. and Canada and internally can reach temperatures of 70° C. internal to the panel. As such the solution needed to operate up to 85° C. without any disruption in operability.

For more than seventy (70) years, HOA selectors and T/S buttons in pump control panels and alarm enclosures have relied on mechanical toggle switches. Despite widespread recognition of the weaknesses of such devices, namely mechanical wear, susceptibility to moisture ingress, and difficulty of sealing enclosures. No manufacturer of control panels has introduced alternative technology, and no sensor manufacturer has targeted this application. Instead, the state of the art has remained unchanged since the 1950s, relying on the same toggle switch architecture.

It would be beneficial if the mechanical toggle switch could be replaced by a device which would not require an additional hole being drilled into the enclosure. Initially, it was thought that the hole in the plastic and toggle switches could be avoided by deploying a capacitive touch sensor. These are deployed in applications from microwaves to phones and cars. The enclosure is generally 2-3 mm thick polycarbonate. It was thought that it should be no problem to get an electrical or magnetic field through the polycarbonate to pick up an action on the other side of the enclosure. However, capacitive technology produces an electric field, capacitive in nature, and even rainwater running down the outside of the enclosure could set off the alarm. This would be annoying for customers if alarms, beacons, or pumps behaved erratically due to rain or wildlife. Any devices to replace the mechanical toggle switch would have to have equal or better reliability for the entire range of ambient conditions and would have to be economically feasible, preferably costing less than the toggle switch.

SUMMARY OF INVENTION

The invention described herein is a pump monitoring system that is in operative communication with a sensor producing a warning signal. The pump monitoring system has a weather-resistant housing that contains an alarm circuit, a metal detector, and a controller. The alarm circuit is activated when the warning signal is received, and the metal detector produces a proximity signal when a metallic object is placed adjacent to and exterior surface of the weather-resistant housing. The controller activates the alarm circuit when the proximity signal is received and the alarm circuit has not been activated by the warning signal, and the controller deactivates the alarm circuit when the proximity signal is received and the alarm circuit has been activated by the warning signal.

In one aspect of the invention, the metal detector is formed by a planar transmit coil and planar receive coils that are on opposite sides of a printed circuit board.

In another aspect of the invention, the metal detector also has a ferrite disk adjacent to one of the coils.

BRIEF DESCRIPTION OF THE DRAWINGS

The present invention will become more fully understood from the detailed description and the accompanying drawings.

DETAILED DESCRIPTION OF THE PREFERRED EMBODIMENTS

The following description of the preferred embodiment(s) is exemplary only and is not intended to limit the invention, its application, or uses.

Figures 1, 2:
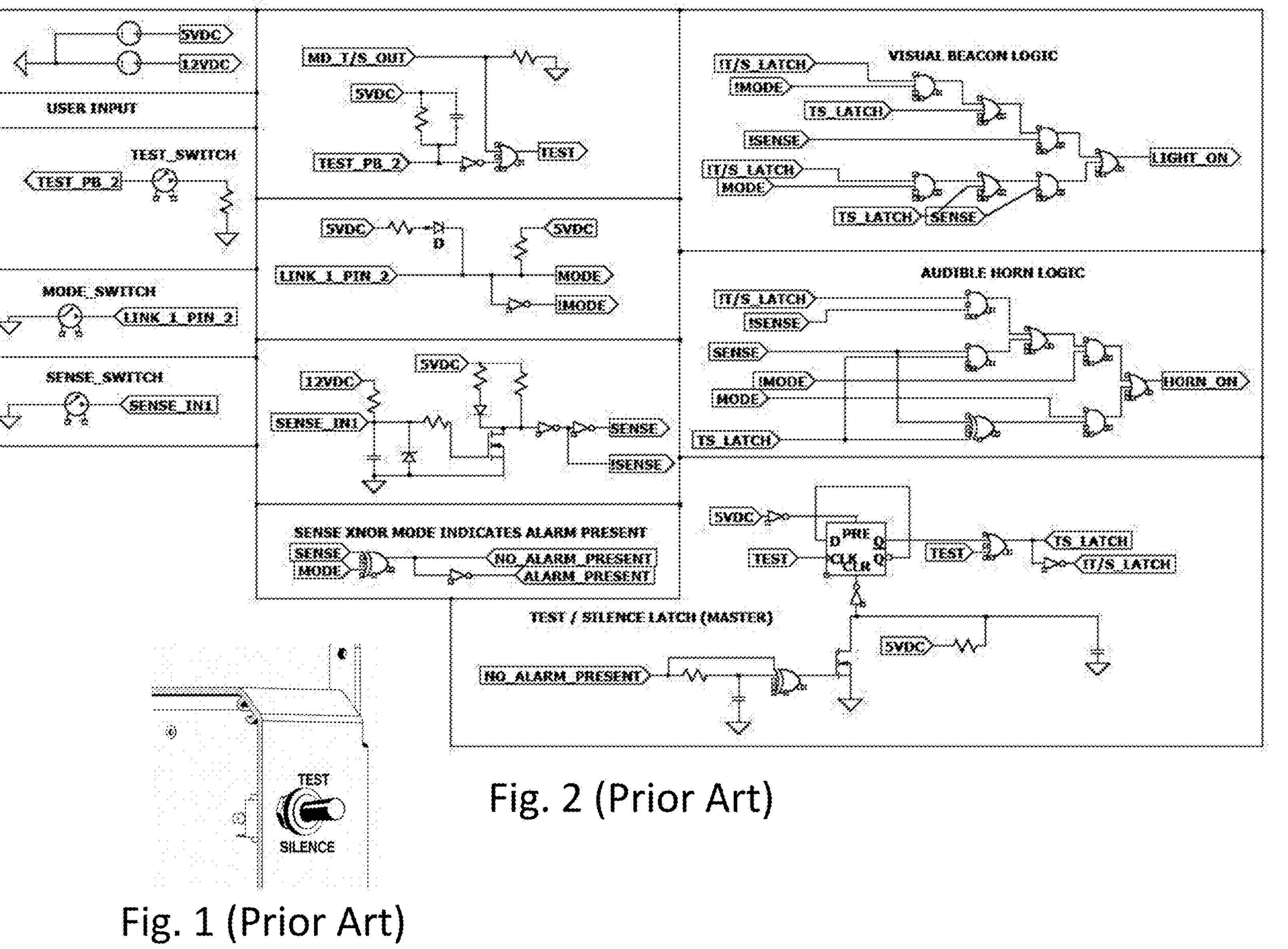
FIG. 1 is a perspective view of a traditional Test/Silence (T/S) or Hand-Off-Auto (HOA) toggle switch mounted in an enclosure, representative of prior-art mechanical control methods requiring enclosure penetration.
FIG. 2 is a logic diagram and circuitry showing the interaction of a traditional actuator (a tactile switch, S3 "Test Switch") used in a traditional high water alarm.
Figures 3, 4:
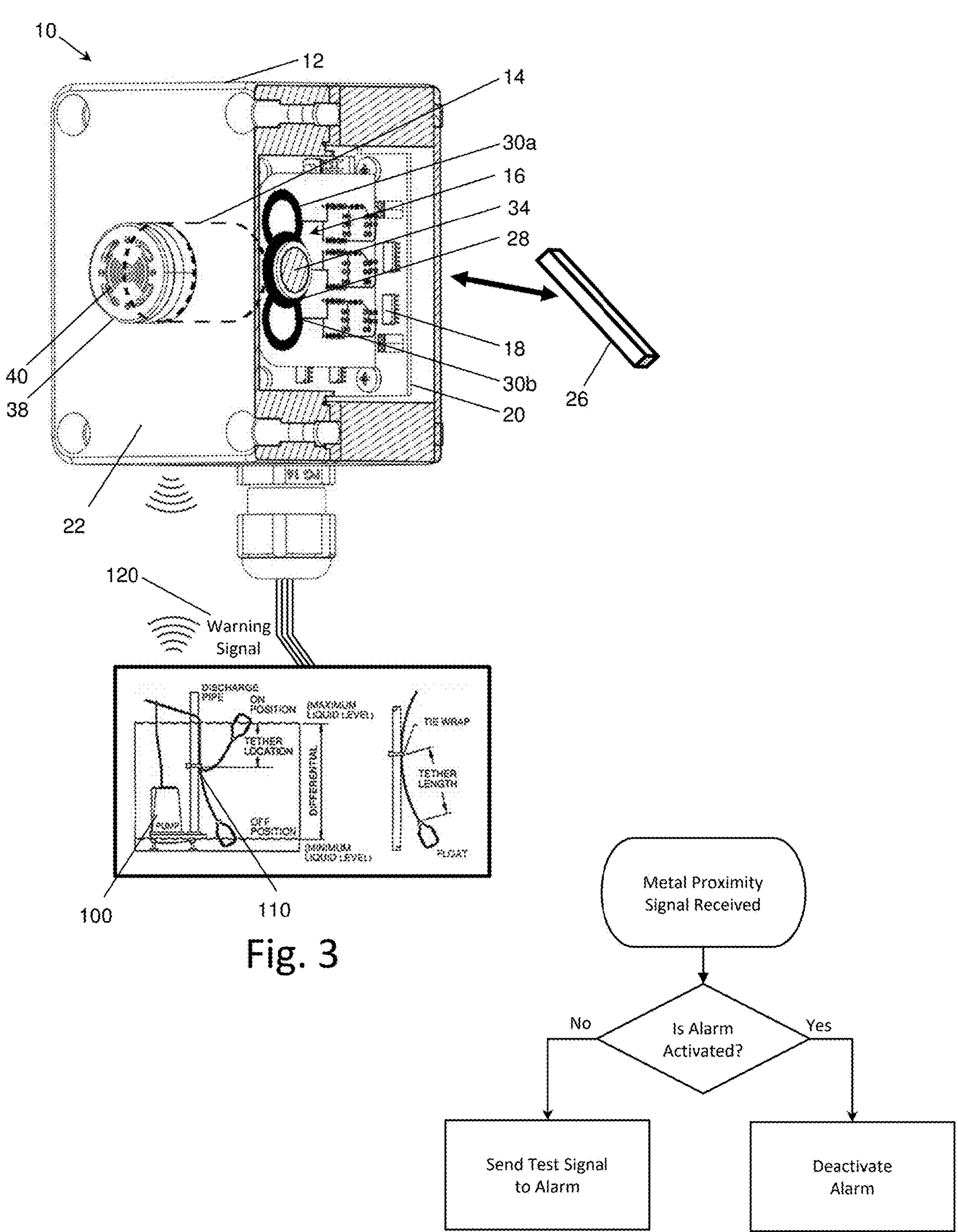
FIG. 3 is a system diagram of the pump monitoring system with a cutaway view showing a metal detector assembly according to the present invention installed in a high-water alarm device.
FIG. 4 is a flowchart illustrating the operation of the metal detector with the alarm circuit.

As generally shown in FIG. 3, the present invention is a pump monitoring system 10 with a weather-resistant housing 12 that contains an alarm circuit 14, a metal detector 16, and a controller 18. The pump monitoring system is in either wired or wireless communication with pumping equipment 100 which has a sensor 110 that produces a warning signal 120, and the metal detector serves as a low-cost, contactless switching method for initiating test and silence (T/S) functions without penetrating the sidewall of the housing. The weather-resistant housing is a non-metallic enclosure having an interior space 20 and an exterior surface 22 which allows reliable operation in outdoor environments subject to the precipitation, such as rain, sleet, and snow, and temperature extremes that can range from −40° C. to +85° C. The particular example shown in FIG. 3 has a level detection sensor with a high water alarm (or control panel), and it will be appreciated that different types of pumping equipment could benefit from the present invention including grinder pumps, septic pumps, and lift stations.

As with current pump monitoring systems which use a toggle switch, the controller activates the alarm circuit when the warning signal is received. However, rather than using a toggle switch for controlling the T/S functions, the metal detector is used. In particular, the metal detector produces a proximity signal 24 when a metallic object 26 is placed adjacent to the exterior surface of the weather-resistant housing, and the proximity signal is communicated to the controller. As shown in FIG. 4, the controller activates the alarm circuit when the proximity signal is received and the alarm circuit has not been activated by the warning signal, and the controller deactivates the alarm circuit when the proximity signal is received and the alarm circuit has been activated by the warning signal. It will be appreciated that the controller could be an analog circuit or a microprocessor, and the circuitry for the alarm circuit could be connected to a light 38 and/or a speaker or other sound producing device 40.

Figure 5:
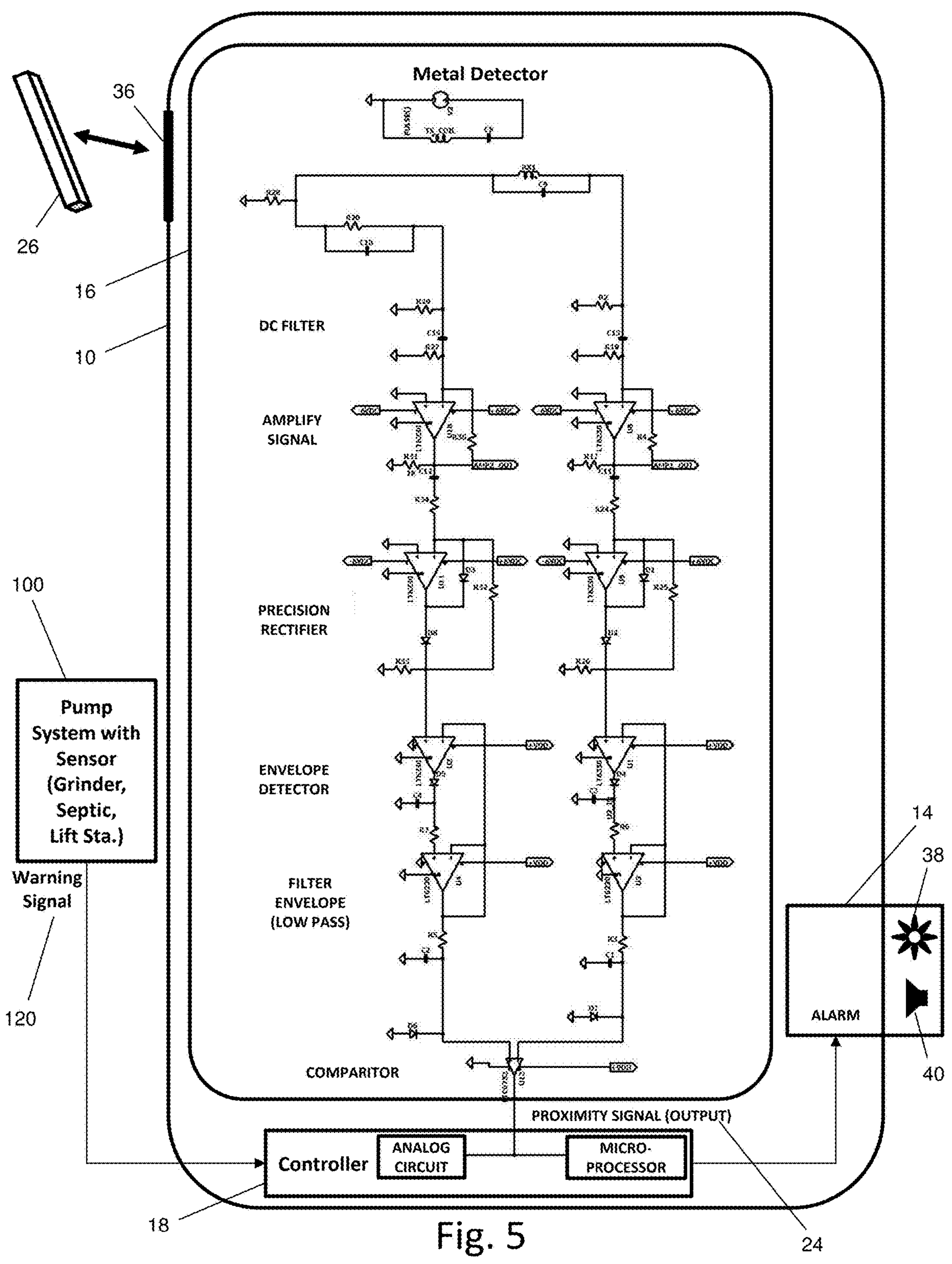
FIG. 5 is a schematic illustration of the invention shown in FIG. 3.

As particularly shown in FIG. 5, the detection circuitry conditions the receive coil signal using amplification, rectification, and envelope detection, producing the proximity signal for the system processor. The receiving coil signals are amplified and put through a precision rectifier, eliminating the negative half of the signal. A precision rectifier must be used as the signals being received are in the microvolt to millivolt range. The rectified signal is then processed through an envelope follower circuit, which effectively converts the signal from an oscillating rectified waveform into a new waveform capturing the average voltage of the output. The waveforms from both receive coils are then put through either a summing operation or a comparator or both to detect a variance between the two receive coils. When metal is "wanded" down the side of the enclosure, the event is captured and is used to change the status of the T/S or alternatively HOA operation of the system via the systems output, the proximity signal. As indicated in the flowchart of FIG. 4, the proximity signal effectively replaces the prior art version of the physical actuator that has been traditionally used. This results in a lower cost pump monitoring system with more reliability. The proximity signal is used in downstream circuitry (either a microprocessor an analog circuit).

Because the coils and circuitry are entirely contained within the enclosure, no gaskets, mechanical switches, or drilled penetrations are required. This reduces manufacturing cost, eliminates water ingress points, and allows activation with gloved hands in cold weather. The PCB-etched coil design requires only inexpensive passive components and can be integrated into new products or adhered to existing enclosures as a retrofit module with exterior labeling. The inventive system provides the benefits listed below.

Contactless Test and Silence capability without enclosure penetration.

Low-cost implementation using PCB-etched coils and standard surface-mount components.

Improved environmental durability and user convenience.

Compatibility with existing pump monitoring and alarm systems.

Figures 6, 7:
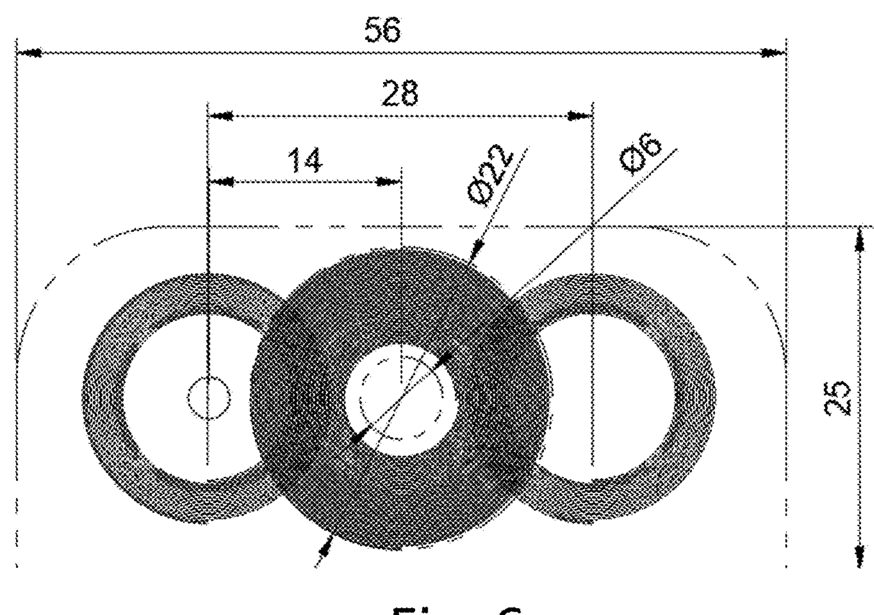
FIG. 6 is a plan view of a preferred coil arrangement for the transmit coil and receive coils in the metal detector.
FIG. 7 is a graph showing the frequency response of receiving coils across a range of excitation frequencies sent to the transmit coil.

The metal detector preferably has a transmit coil (TX) 28 and a pair of receive coils (RX) 30*a*, 30*b* that are formed on a printed circuit board (PCB) 32. In particular, the transmit coil is preferably formed as a planar spiral on the side of the PCB facing the housing's internal sidewall while the planar receive coils are on the opposite side of the PCB facing away from the housing's internal sidewall. In the preferred construction, a ferrite disk 34 is positioned adjacent to at least one coil to focus magnetic flux and improve detection sensitivity through the enclosure wall. When a metallic object, such as metal bar or a screwdriver tip, is placed near a marked activation area 36 on the housing's exterior surface, the magnetic field from the transmit coil is disturbed, producing a measurable change in the receive coil output. This change may be detected through amplitude monitoring (preferred for simplicity and low cost) or phase-shift analysis. The transmit coil is driven by either a sine or square wave source generated by a tank circuit or microcontroller. The receive coils are arranged in a spatially separated, opposing polarity configuration to provide common-mode noise rejection against environmental electromagnetic interference (EMI). As shown in FIG. 6 and discussed in detail below, the receive coils preferably partially overlap opposite sides of the transmit coil, and a center for each of the pair of receive coils is outside a perimeter of the transmit coil.

Design constraints and details of the preferred system and its benefits over other potential technical solutions are discussed below.

In extreme cold temperature applications where a user may have gloved hands, the simple metal detector offers advantages to the traditional means. In the sense that it is far easier to wand a key or a screwdriver past the outside of the enclosure, than to remove the gloves and press what is effectively a "membrane" pushbutton on the outside of the enclosure. To increase the robustness of the device for outdoor usage, it would be an additional benefit to provide for the testing and silencing functionality without requiring any hole in the enclosure. Further, if the user would not have to remember whether they have returned a physical switch to its correct position after having deactivated the alarm circuit due to an event that caused the activation of the alarm circuit, and the event has been rectified.

As the thought process of developing a magnetic test and silence type of system furthered, it was considered to have the user wand a permanent magnet by a predetermined spot on the outside of the enclosure. This would ensure that the action of testing or deactivation of the alarm circuit was intentional. It had to be considered what type of permanent magnet a user may have readily available. It was thought that the user may need a screwdriver to get into the panel anyway, many screwdrivers having magnetic heads. If the detection method was designed around the magnetic head of the screwdriver, that should be triggerable with any magnet, even a refrigerator magnet from a recent vacation. Every home or work van would likely have such a magnet. Even the most sensitive of the components that we purchased off Digikey for picking up a magnetic field in terms of an integrated circuit package did not work for the application. This was a matter of simple math. The sensor was inside of the enclosure by a few millimeters, plus the thickness of the enclosure indicated that the magnet could be 10 mm or more from any surface mount magnetic sensor. With the already weak magnetic field of the permanent magnet dying out at 1/z^3 (where z is the distance from the permanent magnet), it required a stack of 10 or more neodymium magnets to provoke a response. Even placing the screwdriver right onto the sensor often didn't produce a response if the pole of the magnets field was not oriented correctly with respect to the field sensor.

This led to realization that the magnetic field must be produced internally to the enclosure and search for a response from outside the enclosure. A prototype metal detector was constructed of a coil that was about 8 inches in diameter for the transmission of the magnetic flux and a receive coil that was slightly smaller in diameter held internal to the transmit coil. The system worked. It could be seen that when the outside coil was excited at a frequency, the receive coil could be observed on an oscilloscope picking up the flux from the transmit coil and responding with a small voltage wave at the same frequency. When a large metal object was present, the signal from the receive coil on the oscilloscope would change form. The concept was thought to be validated, all that was required was to miniaturize the design onto a PCB board, where the coil could be printed in the copper traces of the PCB. In the design phase it was soon found out that this would oppose the laws of physics.

As indicated above, a satisfactory metal detector preferably not only functions as well as or better than a toggle switch, its cost should also be comparable or less than the toggle switch that it replaces. Preferably, the results in an area for the transmission and receiving coils that is within a rectangular area of 65 mm by 25 mm as shown in FIG. 6 (dimensions in millimeters). With this size constraint, the particular design of the metal detector has several options. The final product could be mounted to the wall of an enclosure with 2-sided tape, however that introduces another failure point that could ultimately succumb to the elements. The enclosures have "back panels" (a steel plate on the back of the enclosure to which components are mechanically mounted), and no two manufacturers have the same distance between a back panel and the enclosure wall. It was calculated that a device with a standard low-cost mounting bracket could be located consistently within 5-7 mm of the enclosure wall. It was also estimated based on calculation and lab testing, that to detect a metal object would require a minimum magnetic field of roughly 0.1 milli Tesla's (mT) present approximately 10 mm away from the transmission coil to reach through the enclosures wall thickness. The formula for the magnetic field strength at a distance (z) from a multiturn coil with N turns is shown below in Equation 1.

$$B = \frac{\mu_0 * N * I * r^2}{2(R^2 + z^2)^{1.5}} \quad \text{Equation 1}$$

Where:

$B$=magnetic flux strength in Tesla (T)

$\mu_0$=permeability of free space $N$=Number of Turns in the coil $I$=current through the coil (in Amperes, A)

$r$=Radius of the coil (in meters, m)

$z$=the perpendicular distance from the coil where the measurement is taken (in meters, m)

The dominant factor in Equation 1 producing the necessary magnetic field (>0.1 mT) at z distance (10 mm) away from the metal detector is the radius (r) of the coil in meters. The number of turns and current are also primary contributors. Having a small coil radius, a minimum trace thickness on the PCB of 0.17 mm, a minimum distance between the traces of 0.17 mm, a low current, and minimum number of turns, none of these factors were in the design's favor to create the required magnetic field on the outside of the enclosure using a small diameter coil.

Generally, these products are located outdoors. It's undesirable for dew to develop inside an enclosure with electronics. As the magnetic field is always present, it requires a low amperage so as not to produce a noticeable temperature rise in cold ambient temperatures.

As mentioned, the designs commercial viability required the transmission coil and receive coils etched in the PCB copper. To achieve a low cost this would mean using no more than 1 oz or (at maximum) 2 oz thick copper on the PCB board.

As 2 oz copper is 10 times the cost of 1 oz copper on a PCB, it's desirable to manufacture with the 1 oz copper. The 1 oz copper trace 0.17 mm wide (the minimum thickness it can be printed) will have a maximum ampacity of about 500 mA before causing undesired temperature rise internal to the panel and creating dew risk. Increasing amperage would not be the solution to a strong B field.

The height limitation of 25 mm limits the diameter of the coil to 22 mm when the required manufacturing distance is left between the coil and the edge of the board. The coil must have an open center for flux to pass through without interference, it was calculated that a minimum 6 mm center would be enough for the flux to pass through, also limiting the amount of available space for turns (N).

Because there is parasitic capacitance between each wrap of the spiral, the wrap before it and the wrap after it, there must be calculated spaces between each wrap often larger than the manufacturing minimum 0.17 mm requirement. The number of turns (N) are defined and limited by the space available, the minimum distance of the opening in the center, the minimum standard trace width and the capacitance created by the spacing between the traces.

Most metal detectors have variable potentiometers (pots) and sometimes variable capacitors for users to adjust and tune the system. These and other components in the design have different performance at different temperatures and create the risk that a user may "de-tune" the device. The design required that the system would never need adjustment and could work from −40° C. to +85° C. without a change in performance or false positives triggering sirens and horns on outdoor control panels.

The next important consideration in the design of a metal detector is what is called the "Q" (or Quality) factor of the inductor (in this case a planar PCB coil) that creates the field. The calculation for Q is shown in Equation 2.

$$Q = (2\pi f L)/R \quad \text{Equation 2}$$

Where:

$Q$=Quality factor $f$=frequency (in Hertz, Hz)

$L$=Inductance (in Henri's, H)

$R$=Resistance (in Ohms, Ω)

A higher Q indicates that the inductor is more ideal with less losses. The design standard for a metal detector is a Q above 50. As shown in Equation 3, the inductance (L) is heavily based on the number of turns (N) in the coil. The resistance (R) is the AC resistance of the coil. Due to skin effect, R rises as the frequency increases, but Equation 2's numerator grows faster than the denominator across the frequency spectrum. The inductance for a planar inductor in the Q equation is defined as follows:

$$L = \frac{\mu_{\mu 0} * N^2 \cdot D_{avg}^2}{(1 + 2.46\rho)} \quad \text{Equation 3}$$

Where:

$\mu_0$=permeability of free space $N$=Number of Turns in the coil $D_{avg}$=The average radius of the coil (in meters, m)

$\rho$=fill factor (no units)

2.46 Empirical constant for a planar, circular coil

As can be seen from Equation 3, the dominant factor for the inductance (L) is the number of turns (N), where the design is most limited. The only variable in Equation 3 not limited by the design is the permeability of free space ($\mu_0$) and frequency.

Most metal detectors operate around the 40 kilohertz range, and this standard was created based on the various types of metals to be detected. Referring to Table 1, the types of metals and the frequencies at which they respond best (i.e. absorb the most magnetic flux) are relatively low.

TABLE 1

Optimal Detection Frequencies for Various Metals. Larger Objects Detectable at the Low End of the Range, Smaller Objects Detectable at the Higher End of the Range

| Metal Type | Examples | Conductivity | Optimal Frequency Range |
|---|---|---|---|
| Gold | Coins, Jewelry | Low | 15-45 kHz |
| Silver | Coins, Jewelry | Very High | 3-10 kHz |
| Copper | Wires, Pipes | High | 3-10 kHz |
| Aluminum | Cans, Foil | Low-Medium | 7-15 kHz |
| Iron/Steel | Nails, Tools | High | 2-10 kHz |
| Lead | Fishing Weight | Medium | 6-15 kHz |
| Brass | Pipe Fitting | Medium-High | 6-12 kHz |
| Nickel | Alloys | Medium | 10-20 kHz |
| Zinc | Modern Penny | Medium-High | 8-12 kHZ |

It's noteworthy that the list of frequencies in Table 1 was developed to get the deepest penetration into metals and use the output to discriminate what type of metal is being detected. In a traditional metal detector this results in a difference in the tone of the sound the detector makes when different types of metals are detected. To a seasoned metal detector operator, they can listen to the sound a metal detector makes on the beach and know that it is just an aluminum bottle cap that is buried under the sand. A piece of gold jewelry on the other hand would make a sound of a different tone. At higher frequencies the metal can still be detected but the discriminatory feature of what type of metal it is becomes lost. Generally, in a standard metal detector, the size of an object determines how loud this sound becomes as it has a larger impact on the B field. At higher frequencies the magnetic flux will have less penetration, and thus result in a relatively diminished response on the receive coil(s). It can also be concluded from the equations above that as a metal detectors grow smaller, it is of benefit to increase the frequency to capture a higher Q factor.

Standard metal detectors are built with a pure sine wave. This is considered optimal because it does not have harmonics as a square wave does. If harmonics are introduced, they generally need to be filtered back out, adding complexity to the detection circuitry.

In summary, a typical metal detector is generally designed with the transmission coil having a high number of turns, large radius, and composed of large conductors which have a low resistance and capable of handling high current. When reduced in size the initial designs had a Q factor in range of 2.6 (versus the target of >50) at 40 Khz, an inductance (L) of 0.1 mH (versus a standard of 5 mH), and field strength at 10 mm of 0.076 mT (versus 0.1 mT Target) using an amperage of 400 mA (causing unacceptable temperature to rise and dew risk). The design in the lab generated heat on the PCB and the switching components for the signal that would have required the use of heat sinks, threatening the overall manufacturing economics and space constraints. If the turns of the coil are too close to each other, this creates capacitance, which creates an electric field with the magnetic field. The electric field will be altered by any materials in the field (changing the dielectric) and would effectively create an "everything detector", while if the coils on the PCB board are too far apart, it further reduces the number of turns (N).

Figure 11:
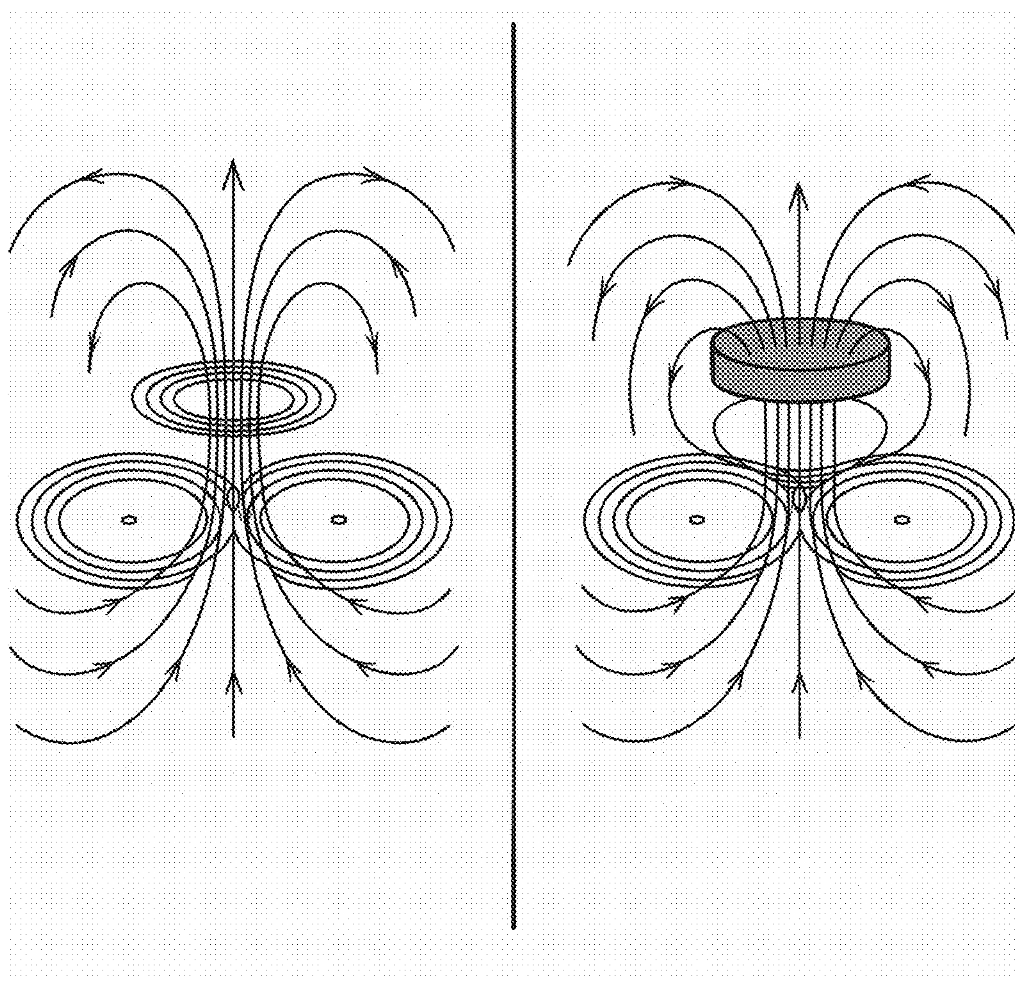
FIG. 11 is a field visualization image showing magnetic flux lines generated by the center transmit coil and passing through the left and right receive coils.

As the equations demonstrate, shrinking a metal detector to the size of a quarter also shrinks the inductance (L), the magnetic field (B) and the Quality factor (Q), requires a high current to compensate. Two variables in these equations that can be manipulated are the permeability of free space ($\mu_0$) and frequency (f). The application does not need to discriminate on what type of metal is being detected, it simply requires detecting any metal, without adjustment, preferably with a low current, and function reliably between −40° C. and 85° C. Thus, frequency can be altered if metal still responds to the magnetic field. The permeability of free space is also something that can be adjusted if we can fill the area between the transmission coil and the outside of the enclosure with something besides air. In this case to produce the Q factor (the higher the Q the less power is lost in the coil, and less power needs to be added), it was necessary to use frequencies higher than the traditional range. This brings forward the question of both metal response as well as environmental electromagnetic interference (EMI) creating false positives as the receiving coils will be tuned to a higher frequency, effectively becoming antennae. Additionally, a ferrite disk can be placed between the metal detector coils and the enclosure walls, increasing the permeability of the space by a multiplier of 500 to 600 depending on the ferrite material. The ferrite material will not create more flux, but because it is a more permeable material, it will create more flux density where it is located. An illustration of this can be seen in FIG. 11. The left side of the image shows the system without the ferrite disk. Flux is generated by the transmit coil and disperses radially outward. The right side of the image shows the same system with the introduction of the ferrite disk. The amount of flux generated by the transmitted coil is the same. The density of the flux centers around the disk, creating a higher concentration of flux.

Altering these variables is enough to produce the magnetic field and make it present outside of the enclosure wall using a lower current at less than 100 mA. The next major hurdle is to be able to receive the magnetic flux on a receiving coil. Typically receiving coils are located geometrically in the center of the transmission coil and are smaller in diameter than the transmission coil. This is also a problem due to the limited space. Putting the receiving coil internal to the transmission coil would only further limit the amount of space available for the transmission coil, reducing the ability to produce the B field. There's a type of metal detector topology called "induction balance" where transmit and receive coils are overlapped over each other, such as shown in FIG. 6. The transmit coil creates a field, and the receiving ring(s) (excited by the transmission coil) naturally create an opposing magnetic field. The two rings are adjusted in space until there is an "overlap" area between the transmission coil and the receive coil where the flux cancels creating a "net 0" effect. In this case, only abnormalities or disturbances in the field produce significant electrical output.

One of the downsides to operating in a higher frequency range is that the metal detector becomes an antenna for EMI. For example, the low kilohertz range does not pick up AM radio in the 550 kilohertz to 1.7-Megahertz range. FM Radio is in the 88-108 MHz range. Of course, the AM/FM radio waves will have harmonics that extend outside of that range, but it was thought to avoid both of those ranges for best results. Due to the higher-than-normal frequencies, it was decided to adopt a design for the receiving coils as two coils overlapping the transmission coil. The theory being that (if the receiving coils wired in opposing fashion) the two overlapping rings would produce signals that would cancel each other out when they simultaneously receive a signal (i.e. EMI). A user movement metal swiping through the coils would produce a result on one coil followed by the other.

The transmit coil is placed on the side of the printed circuit board (PCB) closer to the target with the receive coils being on the other side of the PCB. EMI picked up by either of the receiving coils would also be (theoretically) picked up by the other and if wired in opposing fashion the noise should cancel out.

While typically the goal is to operate any coil at resonance—the design no longer has just one coil. The transmit coil (a very small inductor in the microhenry range) creates a field which is strongest at its resonant frequency. That field will pass through the receive coils, and induce a current in each coil, which will then produce a counter magnetic field, which induces a counter current back into the transmit coil. This can no longer be treated as a single coil, or three single coils. This is now an electromagnetically coupled system also known as a “coupled resonant system”. These systems have two frequency modes, a lower frequency mode ($f_{low}$) which is the frequency at which the TX and RX currents are in phase), and a higher frequency mode ($f_{high}$) where the TX and RX currents are completely out of phase.

This effect can be noted in FIG. 7. In this picture, the transmit coil is excited (which is channel 2), and one of the two receive coils is connected to CH4 of the scope. The box on the left shows the two receiving coils have a peak at a low frequency ($f_{low}$) where the phase of the receiving signal is in phase with the transmit coil. The box on the right shows a second frequency ($f_{high}$) where the receiving coils are at a maximum amplitude, 180° phase shifted from ($f_{low}$). This indicates that (given the topology used) there are frequencies where the system is most efficient with the same power into the transmission coil. Here we see the lower and higher frequency phenomenon. Note that the left box shows the Transmits coil’s resonant frequency, noted by the C2 Phase line going vertically through the zero point on the right Y-Axis. This is $f_{low}$. At this point the transmitting coil is at its theoretical maximum of creating magnetic flux. In the yellow box on the right, we see $f_{high}$. Considering the receive coils are not connected to anything at all, this peak shows a higher amplitude than what is created by the transmit coil alone. This is a system affect, wherein the entire system has an overall coupled inductance, and an overall coupled capacitance at which the system “rings”. This means that energy in terms of changing electric fields, stored in the parasitic & mutual capacitance of three coils, and the inductance of the three coils work together as one “coupled” system.

Figure 8:
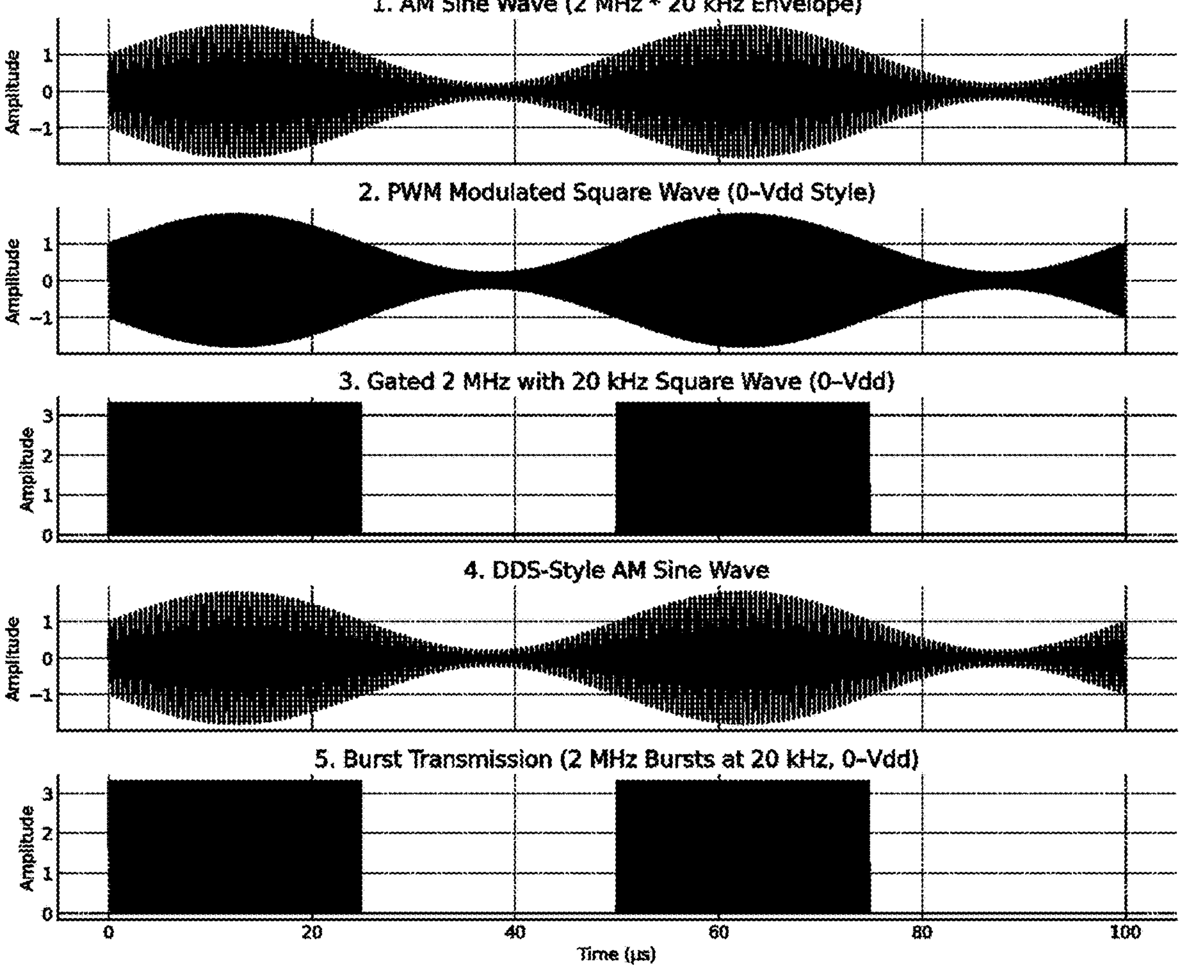
FIG. 8 shows various transmit coil excitation waveforms in the time domain.

This brings us back to the point of detecting metal that responds in lower KHZ frequencies using the higher fundamental frequency in the transmit coil. The coupled behavior outlines that the system is tuned to ring at a specific frequency, and that frequency must be at the value for the calculated higher Q. This was accomplished by looking at a group generated waveforms waves that could have a higher fundamental frequency and have a lower frequency energy to excite the metal, as shown in FIG. 8.

Figure 9:
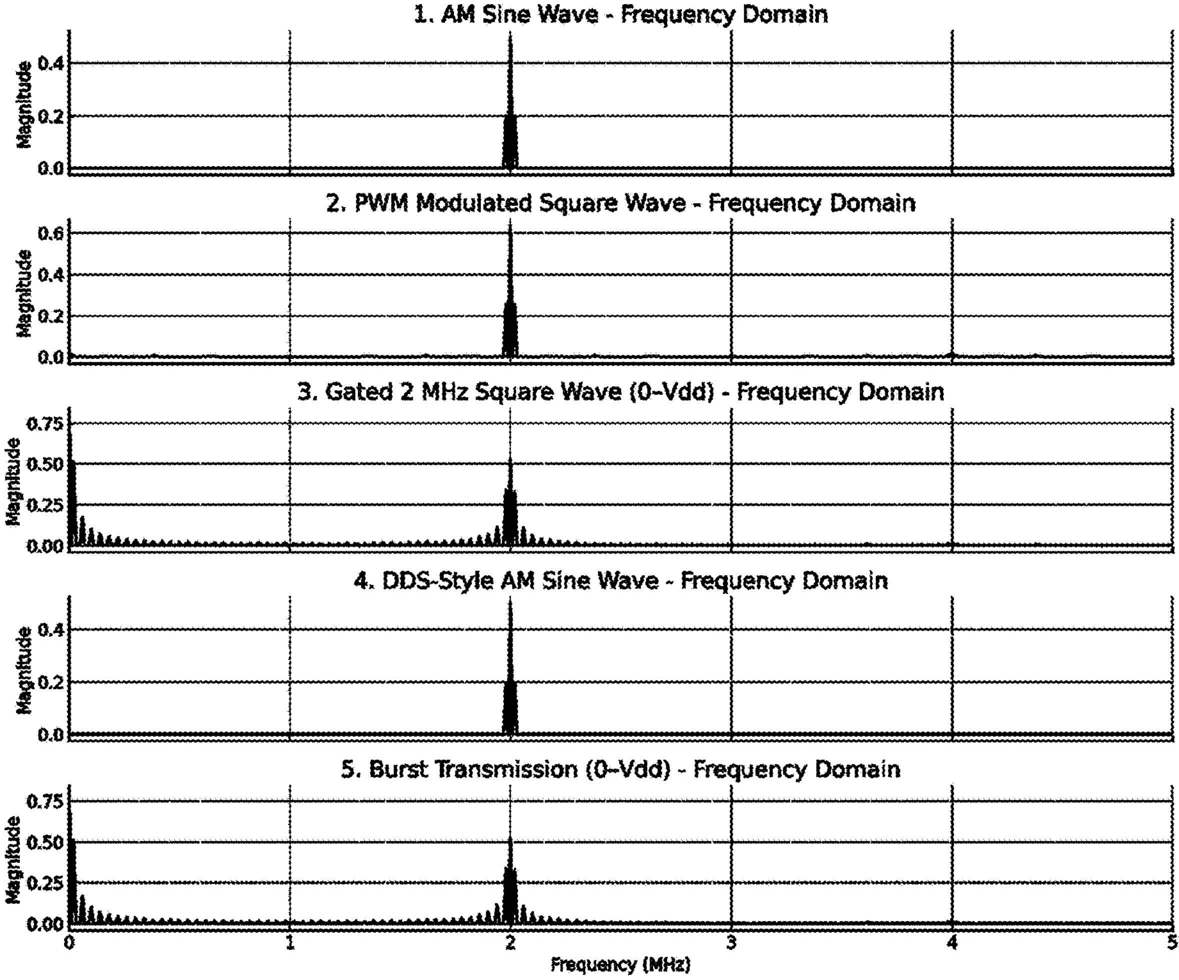
FIG. 9 shows the same transmit coil excitation waveforms from FIG. 8 in the frequency domain.
Figure 10:
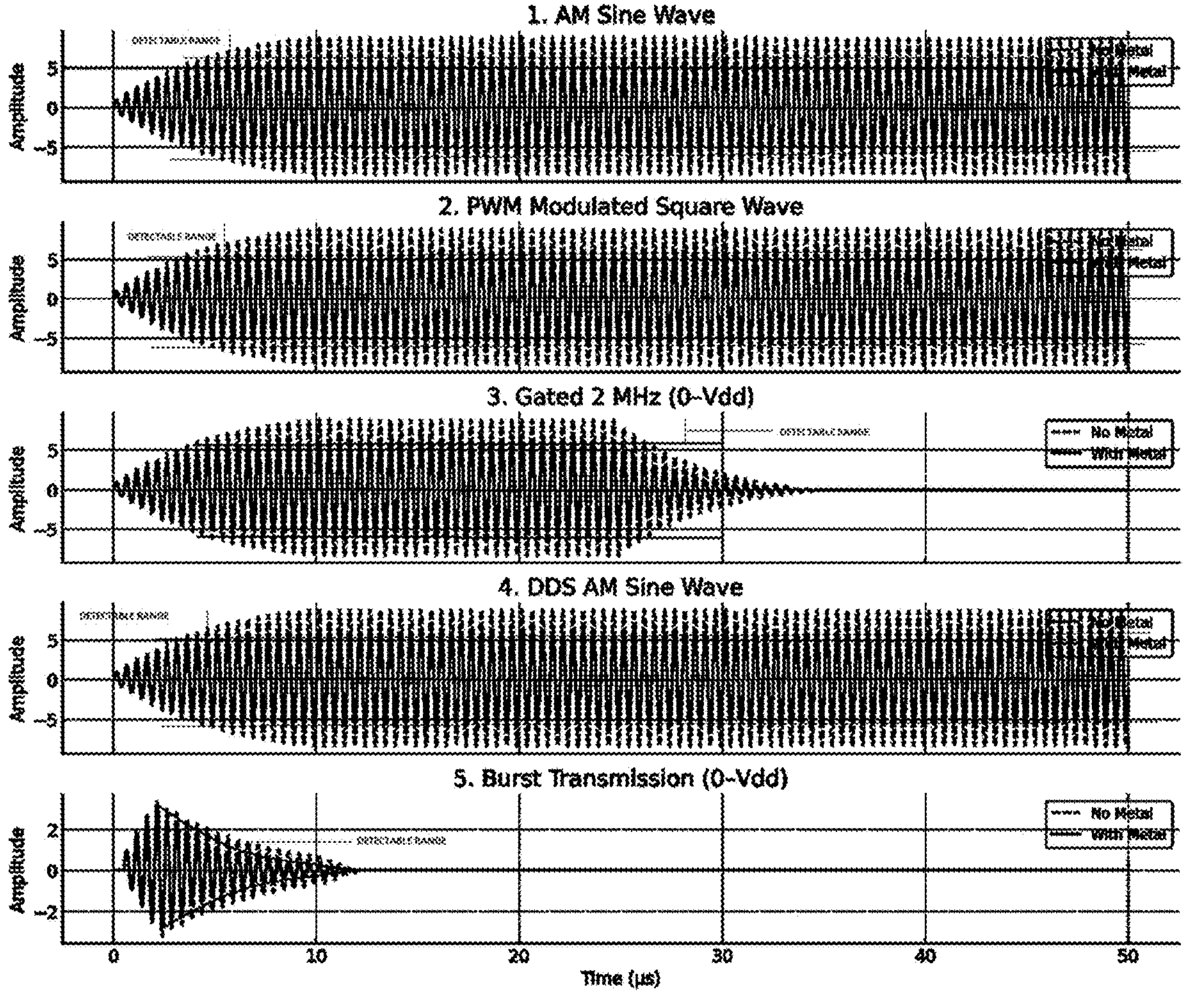
FIG. 10 is a comparative chart showing output response upon detection of metal for each of the five transmitted waveforms of FIGS. 8 and 9.

At first appearance, FIG. 6 waveforms 3 and 5 look identical. Upon closer inspection, they are quite different, and the primary difference is the duty cycle. The difference between them is that waveform 5 has consistent bursts of the high frequency signal with small pauses between them that are not readily apparent in the black and white version. Waveform 3 is simply the higher fundamental frequency turned on and off (Gated) at a lower frequency, while waveform 5 consists of “groups of” higher frequency bursts with “listening time” between them on a period that starts over numerous times within a gated waveform. As shown in FIG. 9, the “Gated Waveform” (3) has the advantage of having harmonics at very low frequencies in the range that metals best respond, with the additional advantage that the amplitude of these frequencies are near to the amplitude of the primary frequency. Waveforms 3 and 5 have a low frequency component that is in the typical range of metals shown in Table 1. Looking at FIG. 10, the detection window in both time and amplitude shift is greater for the Gated Waveform (3) than the Burst Transmission (5). Thin lines have been added showing the “detectable range” which is the difference in the waveforms with and without metal in the detectors field. The “Gated” waveform (3) is easier to create, has desirable low frequency harmonics, and provides for a greater detectable range in terms of amplitude and time duration for reliable detection.

While the embodiment described integrates the metal detection system with a pump monitor, variations may include standalone retrofit kits, alternative coil geometries, or other control applications without departing from the scope of the invention.

The embodiments were chosen and described to best explain the principles of the invention and its practical application to persons who are skilled in the art. As various modifications could be made to the exemplary embodiments, as described above with reference to the corresponding illustrations, without departing from the scope of the invention, it is intended that all matter contained in the foregoing description and shown in the accompanying drawings shall be interpreted as illustrative rather than limiting. For example, inductive proximity sensors that are known in the industry may be incorporated into the present invention but for the reasons explained below, their cost and integration into pump monitoring system make them less advantageous than using the planar metal detectors described above. Thus, the breadth and scope of the present invention should not be limited by any of the above-described exemplary embodiments but should be defined only in accordance with the following claims appended hereto and their equivalents.

Inductive proximity switches that are known in the factory automation industry are sold by different companies, including Turck, IFM, Banner, Eaton, and Rockwell/Allen-Bradley to detect machine parts, conveyor positions, or safety targets. These devices generally use wound coils with hundreds of windings (yielding inductances in the mH range) that are wrapped around ferrite cores and packaged in potted housings, and they typically output only a binary on/off signal. They are designed as general-purpose presence detectors, not as user input devices. They also require bulkier housing and mechanical mounting than the preferred embodiment described above, which are a higher cost to integrate in place of an HOA or T/S toggle, and would still require additional components (such as a relay or a separate PCB) to implement. The overall cost to create the same functionality in the application has prevented proximity sensors that generate their own magnetic field from being implemented. Meanwhile, the proposed invention would lower the overall cost of providing the same functionality. When integrated with downstream electronics, the invention has the potential to become a small state machine that can handle the direct control of beacons, horns, and wireless notifications. While planar PCB coils have been proposed in some contexts, their use has been directed to compact sensing modules in automation, not to human interface controls in sealed alarm enclosures.

On the other hand, in the art of control panel design, designers have not drawn from inductive sensor technology due to the higher cost. Instead, limited experiments with non-contact switches relied on magnetic reed switches or Hall-effect sensors actuated by a permanent magnet. These require specialized activators, have orientation and lifetime limitations, and have not been widely adopted for HOA or T/S functions. The control panel industry therefore continued to rely on mechanical toggles, despite their shortcomings, evidencing a long-felt but unsolved need for a sealed, durable, and user-friendly alternative.

The present invention is not a mere substitution of one known sensor for another. It is a new integration across two disparate arts: it takes a compact, flat PCB-based inductive sensing assembly, designed and tuned not for generic object detection, but for controlled through-wall user actuation, and combines it with the functional logic of Test/Silence and Hand-Off-Auto control in pump panels. Unlike industrial proximity sensors, this device is mounted entirely inside the enclosure without any penetration or protruding housing, and it produces a conditioned proximity signal configured to toggle specific panel states. Unlike control panel reed or Hall solutions, it requires no dedicated magnet or mechanical actuator: a simple metal tool such as a screwdriver can reliably activate it, even in gloved-hand outdoor use. It further operates across-40° C. to +85° C. without recalibration, a requirement of outdoor wastewater and pump stations that generic industrial sensors do not guarantee.

What is claimed is:

1. A pump monitoring system in operative communication with a sensor producing a warning signal, comprising:

a weather-resistant housing having an interior space and an exterior surface;

an alarm circuit positioned within the interior space of the housing, wherein the alarm is activated when the warning signal is received;

a metal detector positioned within the interior space of the housing, wherein the metal detector produces a proximity signal when a metallic object is placed adjacent to the exterior surface of the weather-resistant housing; and a controller situated within the interior space of the housing, wherein the controller is in operative communication with the alarm circuit and the metal detector, wherein the controller is configured to receive the warning signal and the proximity signal, the controller activates the alarm circuit when the alarm signal is received, wherein the controller activates the alarm circuit when the proximity signal is received and the alarm circuit has not been activated by the warning signal, and wherein the controller deactivates the alarm circuit when the proximity signal is received and the alarm circuit has been activated by the warning signal.

2. The pump monitoring system of claim 1, wherein the metal detector is comprised of a transmit coil and a pair of receive coils, wherein the pair of receive coils partially overlap opposite sides of the transmit coil and have opposing polarity to each other.

3. The pump monitoring system of claim 2, wherein the metal detector further comprises a ferrite disk positioned adjacent to at least one of the transmit coil and the pair of receive coils.

4. The pump monitoring system of claim 2, wherein the transmit coil and the pair of receive coils are mounted on a printed circuit board.

5. The pump monitoring system of claim 4, wherein the transmit coil is planar and is mounted on a side of the printed circuit board facing an internal sidewall of the weather-resistant housing, and wherein the pair of receive coils are planar and mounted on an opposite side of the printed circuit board facing away from the internal sidewall of the weather-resistant housing.

6. The pump monitoring system of claim 2, wherein a center for each of the pair of receive coils is outside a perimeter of the transmit coil.

7. The pump monitoring system of claim 1, wherein the controller is comprised of an analog circuit.

8. The pump monitoring system of claim 1, wherein the controller is comprised of a microprocessor.

9. The pump monitoring system of claim 1, wherein the alarm circuit is in operative communication with least one of a sound and a light connected to the exterior surface of the housing.

10. The pump monitoring system of claim 1, wherein the exterior surface of the weather-resistant housing further comprises a marked activation area.

11. A pump monitoring system in operative communication with a sensor producing a warning signal, comprising:

a weather-resistant housing having an interior space and an exterior surface;

an alarm circuit positioned within the interior space of the housing, wherein the alarm circuit is activated when the warning signal is received;

a metal detector positioned within the interior space of the housing, wherein the metal detector is comprised of a planar transmit coil and a pair of planar receive coils and produces a proximity signal when a metallic object is placed adjacent to the exterior surface of the weather-resistant housing; and a controller situated within the interior space of the housing, wherein the controller is in operative communication with the alarm circuit and the metal detector, wherein the controller is configured to receive the warning signal and the proximity signal, the controller activates the alarm circuit when the alarm signal is received, wherein the controller activates the alarm circuit when the proximity signal is received and the alarm circuit has not been activated by the warning signal, and wherein the controller deactivates the alarm circuit when the proximity signal is received and the alarm circuit has been activated by the warning signal.

12. The pump monitoring system of claim 11, wherein the pair of planar receive coils partially overlap opposite sides of the planar transmit coil and have opposing polarity to each other.

13. The pump monitoring system of claim 11, wherein the exterior surface of the weather-resistant housing further comprises a marked activation area.

14. The pump monitoring system of claim 11, wherein the metal detector further comprises a ferrite disk positioned adjacent to at least one of the planar transmit coil and the pair of planar receive coils.

15. The pump monitoring system of claim 11, wherein the planar transmit coil and the pair of planar receive coils are mounted on a printed circuit board.

16. The pump monitoring system of claim 11, wherein a center for each of the pair of planar receive coils is outside a perimeter of the planar transmit coil.

17. A method for controlling an alarm circuit in a pump monitoring system in operative communication with a sensor producing a warning signal, comprising:

providing a weather-resistant housing having an interior space and an exterior surface, wherein the alarm circuit is positioned within the interior space of the housing; producing a proximity signal with a metal detector when a metallic object is placed adjacent to the exterior surface of the weather-resistant housing, wherein the metal detector is positioned within the interior space of the housing; and receiving the proximity signal in a controller situated within the interior space of the housing, wherein the controller activates the alarm circuit when the warning signal is received in the controller, wherein the controller activates the alarm circuit when the proximity signal is received and the alarm circuit has not been activated by the warning signal, and wherein the controller deactivates the alarm circuit when the proximity signal is received and the alarm circuit has been activated by the warning signal.

18. The method of claim 17, wherein the metal detector is comprised of a transmit coil and a pair of receive coils mounted on a printed circuit board.

19. The method of claim 18, wherein the transmit coil is mounted on a side of the printed circuit board facing an internal sidewall of the weather-resistant housing, and wherein the pair of receive coils are mounted on an opposite side of the printed circuit board facing away from the internal sidewall of the weather-resistant housing.

20. The method of claim 18, wherein the pair of receive coils partially overlap opposite sides of the transmit coil and have opposing polarity to each other.

* * * * *